US009506961B2

(12) United States Patent
Chiu et al.

(10) Patent No.: US 9,506,961 B2
(45) Date of Patent: Nov. 29, 2016

(54) POWER SUPPLY DETECTION APPARATUS AND DETECTING METHOD THEREOF

(71) Applicant: Chicony Power Technology Co., Ltd., New Taipei (TW)

(72) Inventors: Yu-Pu Chiu, New Taipei (TW); Sai-Ting Chou, New Taipei (TW); Hsiao-Chih Ku, New Taipei (TW); Jhen-Siang Huang, New Taipei (TW); Wen-Nan Huang, New Taipei (TW); Ching-Guo Chen, New Taipei (TW); Shiu-Hui Lee, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 96 days.

(21) Appl. No.: 14/560,149

(22) Filed: Dec. 4, 2014

(65) Prior Publication Data

US 2016/0161534 A1    Jun. 9, 2016

(51) Int. Cl.
*G01R 1/067* (2006.01)
*G01R 21/00* (2006.01)
*G01R 31/28* (2006.01)

(52) U.S. Cl.
CPC ........... *G01R 21/00* (2013.01); *G01R 1/06705* (2013.01); *G01R 31/28* (2013.01)

(58) Field of Classification Search
None
See application file for complete search history.

(56) References Cited

U.S. PATENT DOCUMENTS

| 4,272,892 A * | 6/1981 | Rose | G01B 5/0002 324/750.25 |
| 6,411,079 B1 * | 6/2002 | Nishikawa | G01R 31/2887 324/750.19 |
| 7,015,711 B2 * | 3/2006 | Rothaug | G01R 31/2808 324/750.02 |
| 8,008,938 B2 * | 8/2011 | Ni | G01R 31/2806 324/754.01 |
| 2003/0084845 A1 | 5/2003 | Prentice et al. | |
| 2010/0033835 A1 | 2/2010 | Heim et al. | |
| 2010/0063637 A1 | 3/2010 | Crowell et al. | |

FOREIGN PATENT DOCUMENTS

| TW | 440690 B | 6/2001 |
| TW | 515893 B | 1/2003 |
| TW | 201100986 A | 1/2011 |
| TW | 201202685 A | 1/2012 |

OTHER PUBLICATIONS

The Office Action Dated Aug. 27, 2015 of the Corresponding Taiwan Patent Application No. 103134676.

* cited by examiner

*Primary Examiner* — Paresh Patel
(74) *Attorney, Agent, or Firm* — Chun-Ming Shih; HDLS IPR Services

(57) ABSTRACT

A power supply detection apparatus including a base, a couple of longitudinal motion mechanisms, a couple of lateral motion mechanisms, a couple of pin bases and a couple of vertical motion mechanisms is provided. Each lateral motion mechanism is movably arranged on the corresponding longitudinal motion mechanism and thereby driven to move horizontally. Each pin base is driven to move horizontally by the corresponding lateral motion mechanism and a probe is arranged on each pin base. The probe and the perpendicular lateral motion mechanism are moved along respective directions perpendicular with each other. Each vertical motion mechanism is arranged on the corresponding pin base for driving the probe to move vertically. The probes can be thereby moved to automatically detect an electric power status of an electronic component on a circuit board of a power supply.

12 Claims, 8 Drawing Sheets

POWER SUPPLY DETECTION APPARATUS AND DETECTING METHOD THEREOF

FIELD OF THE INVENTION

The present invention relates to detection apparatuses, and more particularly to an electronic component detection apparatus for automatically detecting an electric power status of an electronic component installed on a circuit board of a power supply.

BACKGROUND OF THE INVENTION

In general, a conventional detection apparatus for detecting an electric power status of an electronic component installed on a circuit board comprises a couple of probes and an oscilloscope coupled to the couple of probes. In a general detection method, a circuit board is electrically coupled to a power supply (such as an AC power supply) and a load simulator (Electrical Load/e Load), such that the AC power supply device supplies a predetermined voltage to the circuit board, and the load simulator simulates a predetermined power load of the circuit board. In the conventional detection apparatus, users need to hold two probes manually by hands to touch related pins of each electronic component respectively in order to obtain a voltage value between the two pins, and an oscilloscope is provided for displaying a waveform diagram of the voltage value, and then the users manually record the voltage value of each electronic component. Therefore, the conventional detection apparatus detects the electric power statuses of a large number of electronic components installed on the circuit board and thus the application is time consuming.

In view of the aforementioned problem of the prior art, the inventor of the present invention based on years of experience in the related industry to conduct extensive researches and experiments and provide a feasible solution in accordance with the present invention to overcome the problems of the prior art.

SUMMARY OF THE INVENTION

Therefore, it is a primary objective of the present invention to provide a power supply detection apparatus and a power supply detection method for automatically detecting an electric power status of an electronic component installed on a circuit board of a power supply.

To achieve the aforementioned objective, the present invention provides a power supply detection apparatus comprising a base, a couple of longitudinal motion mechanisms, a couple of lateral motion mechanisms, a couple of pin bases and a couple of vertical motion mechanisms. The couple of longitudinal motion mechanisms are installed to the base. Each lateral motion mechanism is movably arranged on the corresponding longitudinal motion mechanism and driven by the longitudinal motion mechanism to move horizontally. Each pin base is installed at each lateral motion mechanism and disposed on each pin base, and a probe is movably erected from the pin base, and each pin base may be driven by the lateral motion mechanism to move horizontally, and the moving direction of the pin base is perpendicular to the moving direction of the lateral motion mechanism. The vertical motion mechanism is installed at the pin base and coupled to the probe for driving the probe to move vertically.

In the power supply detection apparatus and method of the present invention, the controlling device is provided for controlling the driving unit to drive the longitudinal motion mechanism, the lateral motion mechanism and the vertical motion mechanism separately, so that the probe can be moved automatically to detect the voltage of an electronic component installed on a circuit board.

DESCRIPTION OF THE PREFERRED EMBODIMENTS

Figure 1:
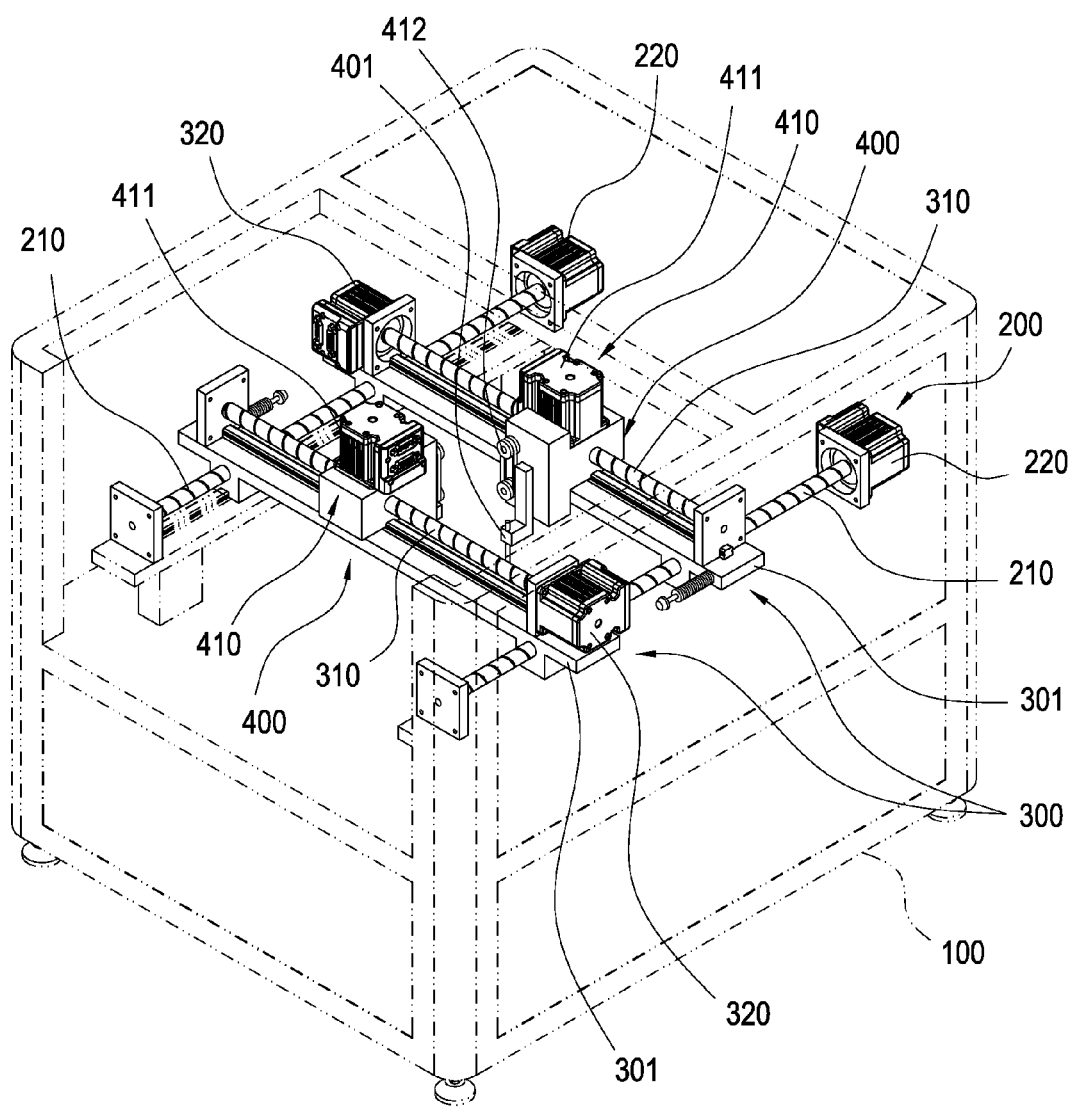
FIG. 1 is a perspective view of a power supply detection apparatus in accordance with a first preferred embodiment of the present invention.

The technical contents of the present invention will become apparent with the detailed description of a preferred embodiment accompanied with the illustration of related drawings as follows. It is noteworthy that same numerals are used for representing same respective elements in the drawings.

With reference to FIGS. 1 to 4 for a power supply detection apparatus in accordance with the first preferred embodiment of the present invention, the power supply detection apparatus comprises a base 100, a couple of longitudinal motion mechanisms 200, a couple of lateral motion mechanisms 300, a couple of pin bases 400, a couple of vertical motion mechanisms 410, a driving unit 510, a controlling device 520, an oscilloscope 610, a recording device 620 and an interface conversion device 630.

Figure 3:
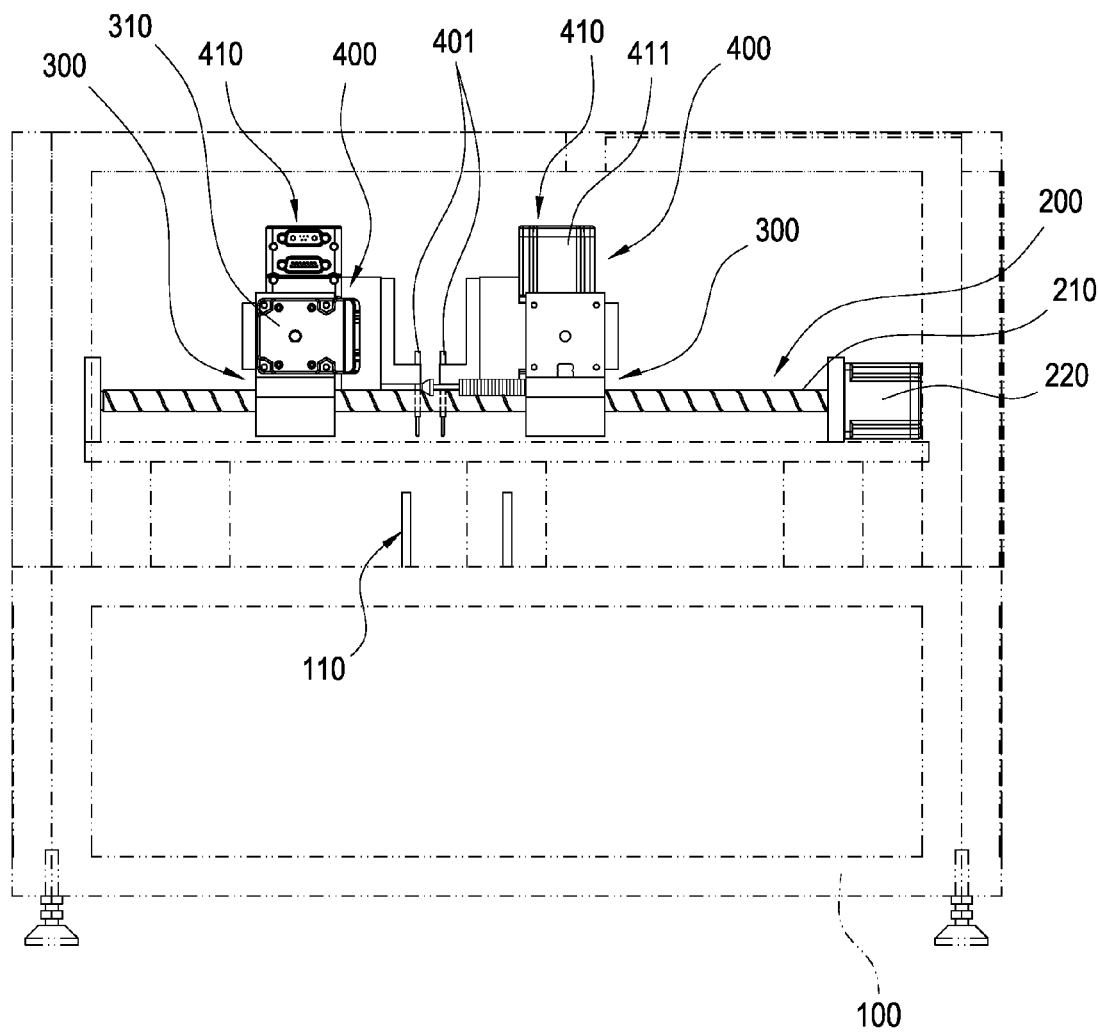
FIG. 3 is a side view of a power supply detection apparatus in accordance with the first preferred embodiment of the present invention.

In this preferred embodiment as shown in FIGS. 1 and 3, the base 100 includes a carrier platform 110, wherein the longitudinal motion mechanism 200 is installed on the base. Each longitudinal motion mechanism 200 includes a longitudinal screw 210 and a longitudinal driving motor 220, wherein the longitudinal screw 210 is horizontally installed on the base 100. The two longitudinal screws 210 are arranged parallelly with an interval apart from each other, and the carrier platform 110 is disposed between the two longitudinal screws 210. Each longitudinal driving motor 220 is installed at the base 100 and coupled to the corresponding longitudinal screw 210, and each longitudinal driving motor 220 can drive the longitudinal screw 210 to rotate axially.

Figure 2:
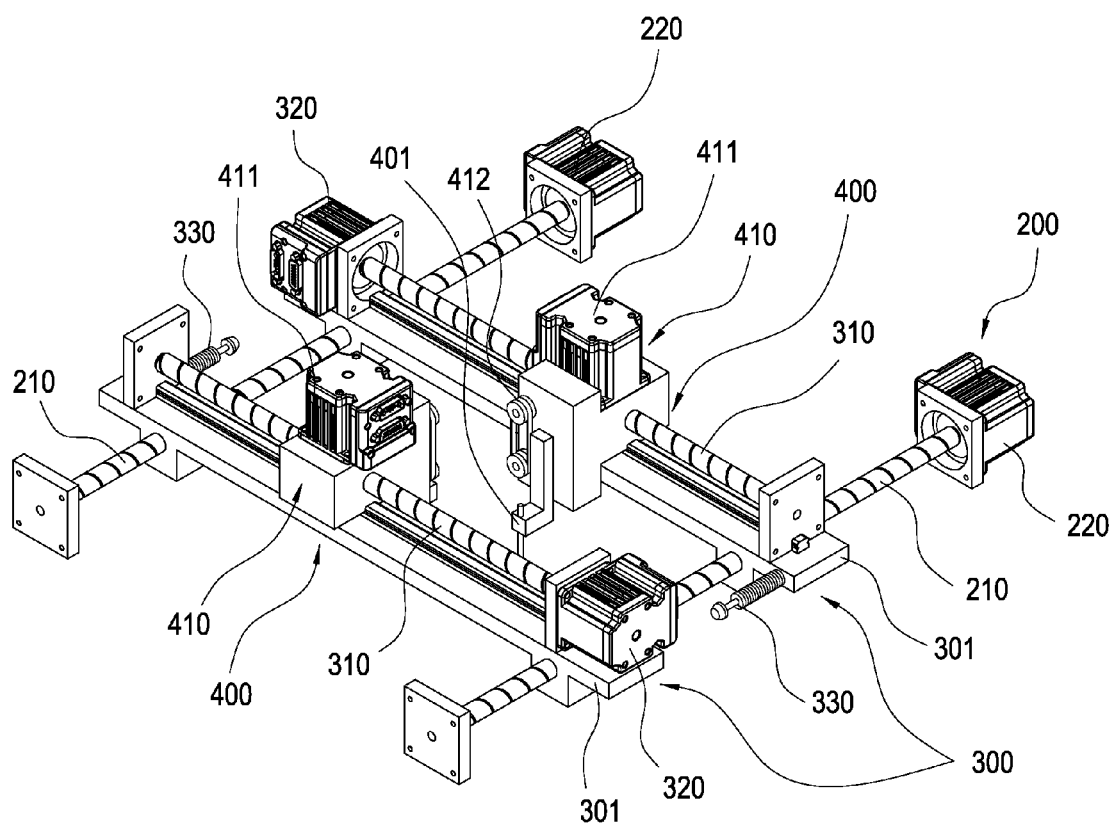
FIG. 2 is another perspective view of a power supply detection apparatus in accordance with the first preferred embodiment of the present invention.

In FIGS. 1 and 2, each lateral motion mechanism 300 is movably arranged on the longitudinal motion mechanism 200 and driven by the longitudinal motion mechanism 200 to move horizontally. In this preferred embodiment, each lateral motion mechanism 300 is disposed across the two longitudinal motion mechanisms 200 and driven by one of the longitudinal motion mechanisms 200 to move. Each lateral motion mechanism preferably includes a seat 301, a lateral screw 310 and a lateral driving motor 320. Each seat 301 is substantially in the shape of a long-strip disposed across two longitudinal screws 210, and the seat 301 has an end engaged with the corresponding longitudinal screw 210 and the other end movably sheathed on the other longitudinal screw 210. In each lateral motion mechanism 300, the lateral screw 310 is installed horizontally on the seat 301 and perpendicular to each longitudinal screw 210. Each lateral driving motor 320 is installed to the corresponding seat 301 and coupled to the lateral screw 310, and is capable of driving the lateral screw 310 to rotate axially. When the longitudinal screw 210 is rotated, the engaged lateral motion mechanism 300 is rotated to move, and when the lateral motion mechanism 300 is moved, the longitudinal screw 210 to be sheathed can guide the lateral motion mechanism 300. In this preferred embodiment, at least one of the lateral motion mechanisms 300 includes a buffer rod 330 installed in a direction towards the other lateral motion mechanism 300 and preferably includes a soft and elastic end, and a spring is provided for coupling the seat 301 to prevent the two lateral motion mechanism 300 from hitting each other while moving in opposite directions respectively.

In FIGS. 2 and 3, each pin base 400 is installed to the respective lateral motion mechanism 300 and engaged with the respective lateral screw 310, such that when the lateral screw 310 is rotated, the engaged pin base 400 is driven to move horizontally along the lateral screw 310, wherein the moving direction of the pin base 400 is perpendicular to the moving direction of the lateral motion mechanism 300. Each pin base 400 includes a probe 401 erected from the pin base 400 and movable vertically with respect to the pin base 400.

Each vertical motion mechanism 410 is installed to the respective pin base 400, and each vertical motion mechanism 410 comprises an elevation driving motor 411 coupled to the probe 401 and the driving motor 411 drives the probe 401 to move vertically along an axial direction. In this preferred embodiment, the elevation driving motor 411 and the probe 401 are preferably coupled by a rubber crawler belt 412. While the probe 401 is moving and being blocked, the elasticity of the rubber crawler belt 412 provides a buffering function. However, the present invention is not limited to such arrangement only.

Figure 4:
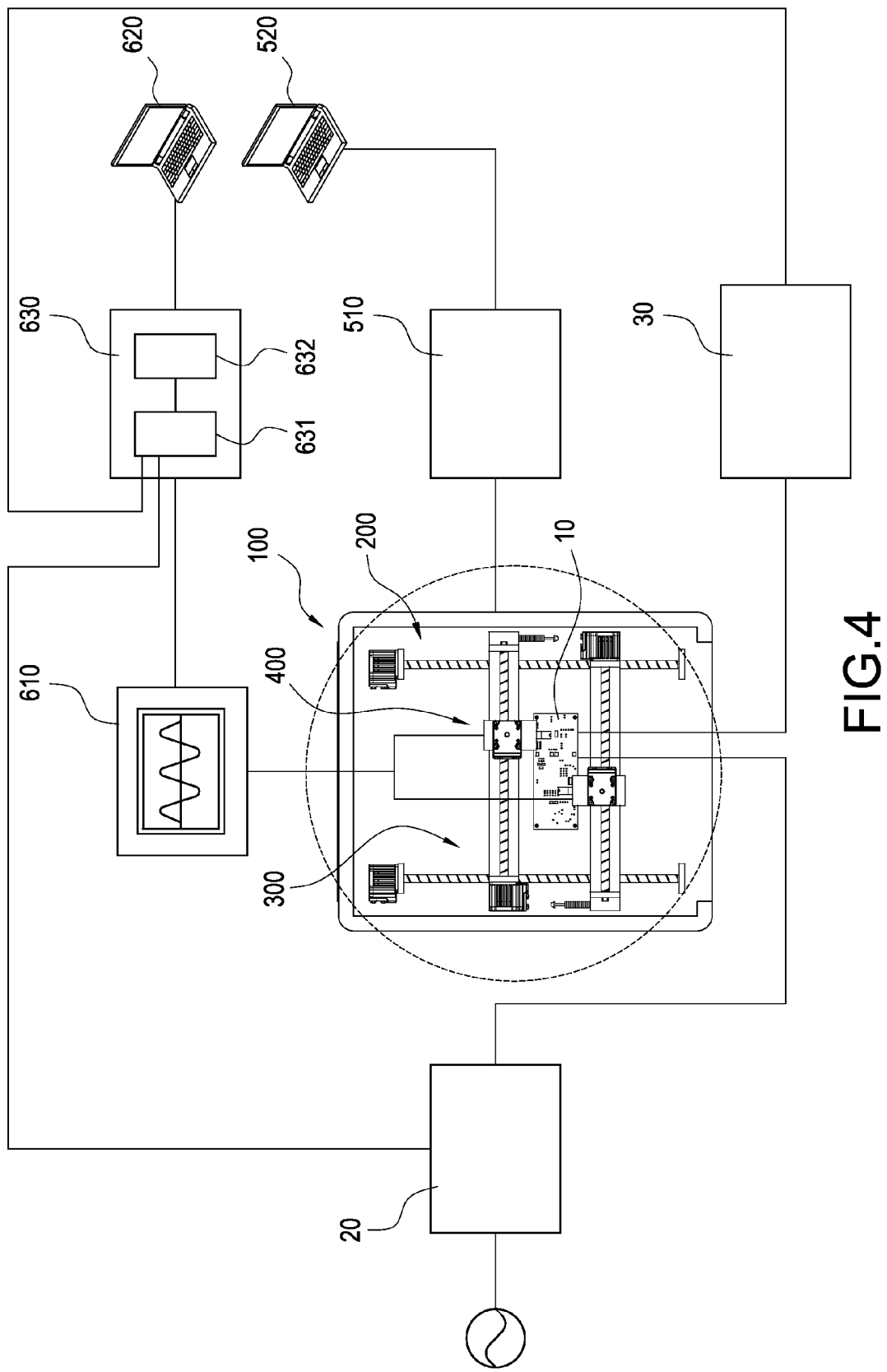
FIG. 4 is a schematic layout diagram of a block view of a power supply detection apparatus in accordance with the first preferred embodiment of the present invention.

In FIG. 4, the driving unit 510 is electrically coupled to each longitudinal driving motor 220, each lateral driving motor 320 and each elevation driving motor 411 and provided for driving each longitudinal driving motor 220, each lateral driving motor 320 or each elevation driving motor 411 to operate. The controlling device 520 is electrically coupled to the driving unit 510 for controlling the driving unit 510 to drive each longitudinal driving motor 220, each lateral driving motor 320 or each elevation driving motor 411, wherein the controlling device 520 includes but not limited to a computer.

The oscilloscope 610 is electrically coupled to each probe 401, and the recording device 620 is electrically coupled to the oscilloscope 610, wherein the recording device 620 includes but not limited to a computer.

The interface conversion device 630 is bridged between the oscilloscope 610 and the recording device 620, and the interface conversion device 630 includes a first connector 631 and a second connector 632 having different specifications and coupled to electrically coupled to each other. The oscilloscope 610 is electrically coupled to the first connector 631 by an electronic wire, and the recording device 620 is electrically coupled to the second connector 632 by an electronic wire. In this preferred embodiment, the first connector 631 and the oscilloscope 610 come with the General Purpose Interface Bus (GPIB) specification, and the second connector 632 and the recording device 620 come with the Universal Serial Bus (USB) specification.

Figure 5:
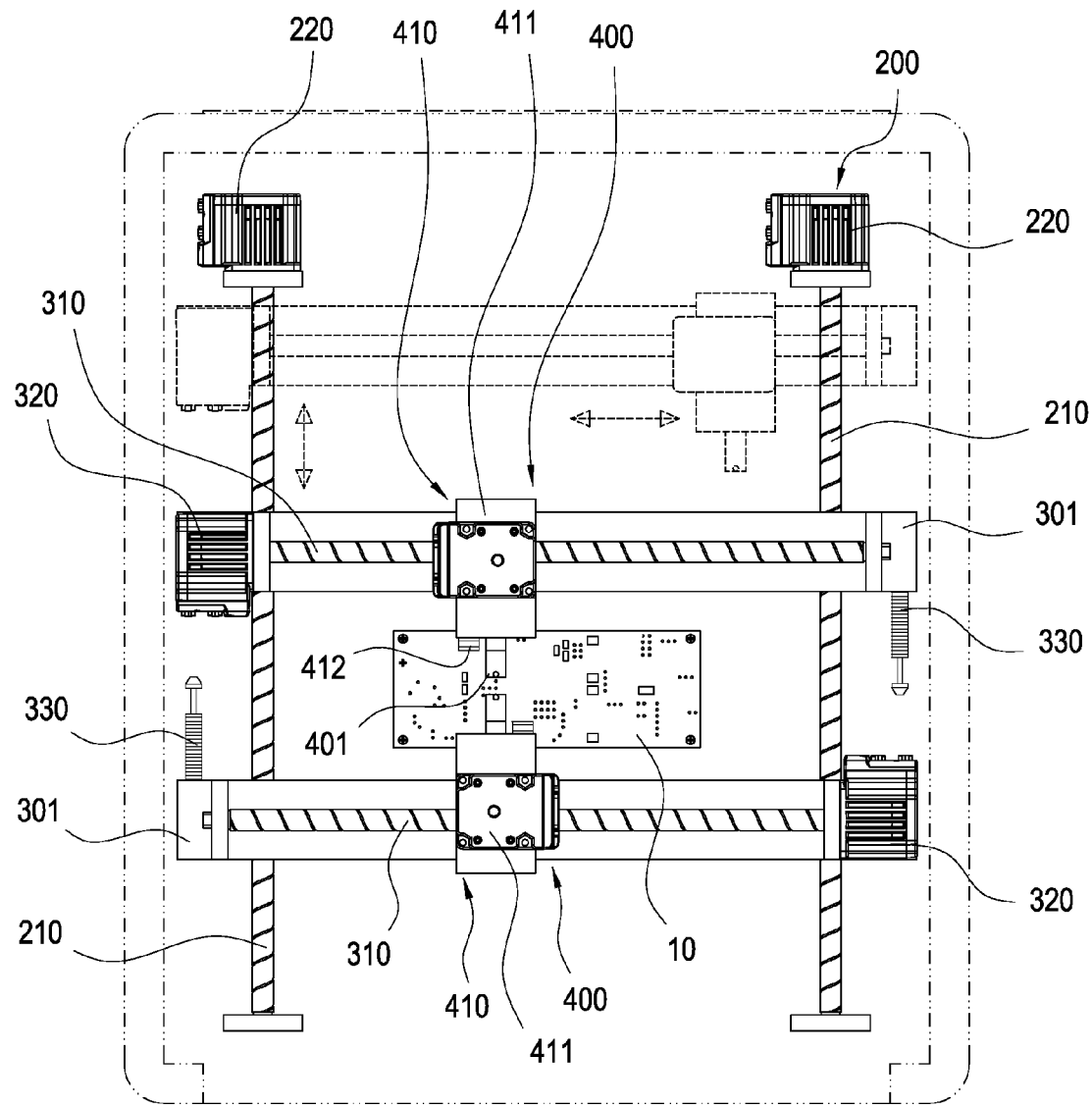
FIG. 5 is a schematic view of a working status of a power supply detection apparatus in accordance with the first preferred embodiment of the present invention.
Figure 6:
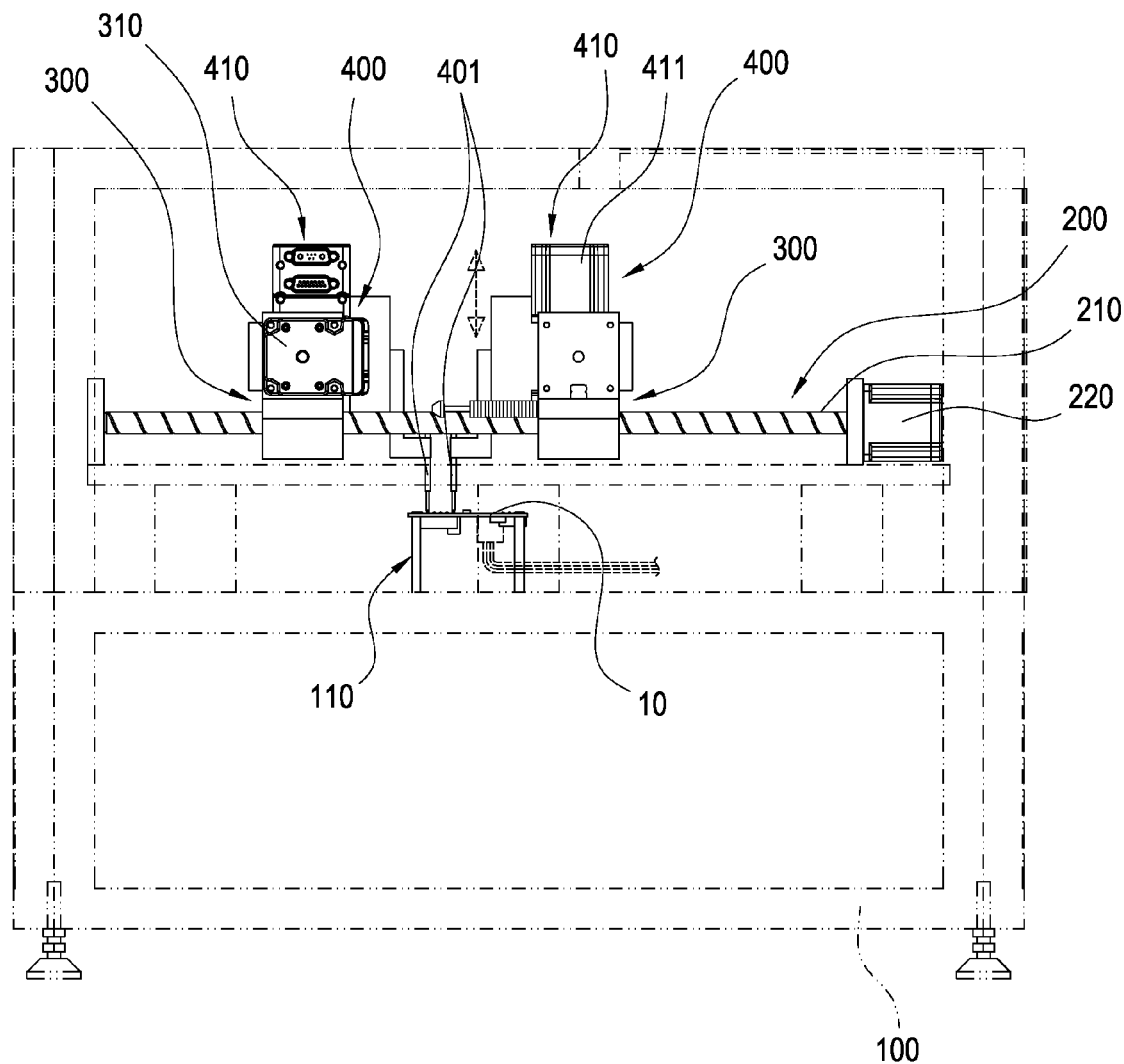
FIG. 6 is a schematic view of another working status of a power supply detection apparatus in accordance with the first preferred embodiment of the present invention.

In FIGS. 5 and 6, the power supply detection apparatus of the present invention is provided for detecting an electric power status (such as voltage or current) of an electronic component installed on a circuit board 10. In this preferred embodiment, the circuit board 10 is applied to a power supply and disposed horizontally on a carrier platform. The circuit board 10 is electrically coupled to an AC power supply device 20 and a load simulator 30 (Electrical Load/e Load), wherein the AC power supply device 20 is a power supply for supplying a predetermined voltage to the circuit board 10, and the load simulator 30 is provided for simulating a predetermined power load of the circuit board 10.

In FIGS. 4 and 5, the controlling device 520 is preloaded with a component layout diagram of the circuit board 10, and the controlling device 520 outputs the coordinate value of each electronic component installed on the circuit board 10 to the driving unit 510, so that the driving unit 510 can drive each longitudinal driving motor 220 and each lateral driving motor 320 to move each probe 401 to the top of a pin of an electronic component to be tested.

In FIGS. 4 and 6, the driving unit 510 drives each elevation driving motor 411 to descend each probe 401 until the probe 401 touches the pin of the electronic component to be tested, so as to measure the data between the two pins. When the probe 401 touches the respective pin, the elasticity of the rubber crawler belt 412 provides a buffering function to prevent damages to the circuit board 10 or the electronic component installed on the circuit board 10.

The oscilloscope 610 is provided for capturing the data measured by the probe and displaying the measured data of a waveform change with respect to time. The measured data are transmitted from the interface conversion device 630 to the recording device 620 and recorded by the recording device 620. In this preferred embodiment, the measured data recorded in the recording device 620 are preferably transmitted by software preloaded in the recording device, wherein the data may be transmitted via email. However, the present invention is not limited by such method only.

In the power supply detection apparatus of the present invention, the controlling device 520 is provided for controlling the driving unit 510 to drive the longitudinal motion mechanism 200, the lateral motion mechanism 300 and the vertical motion mechanism 410, so that the probe 401 can be moved automatically to detect the voltage of an electronic component installed on the circuit board 10, and the recording device 620 is provided for capturing the measured result.

Figure 7:
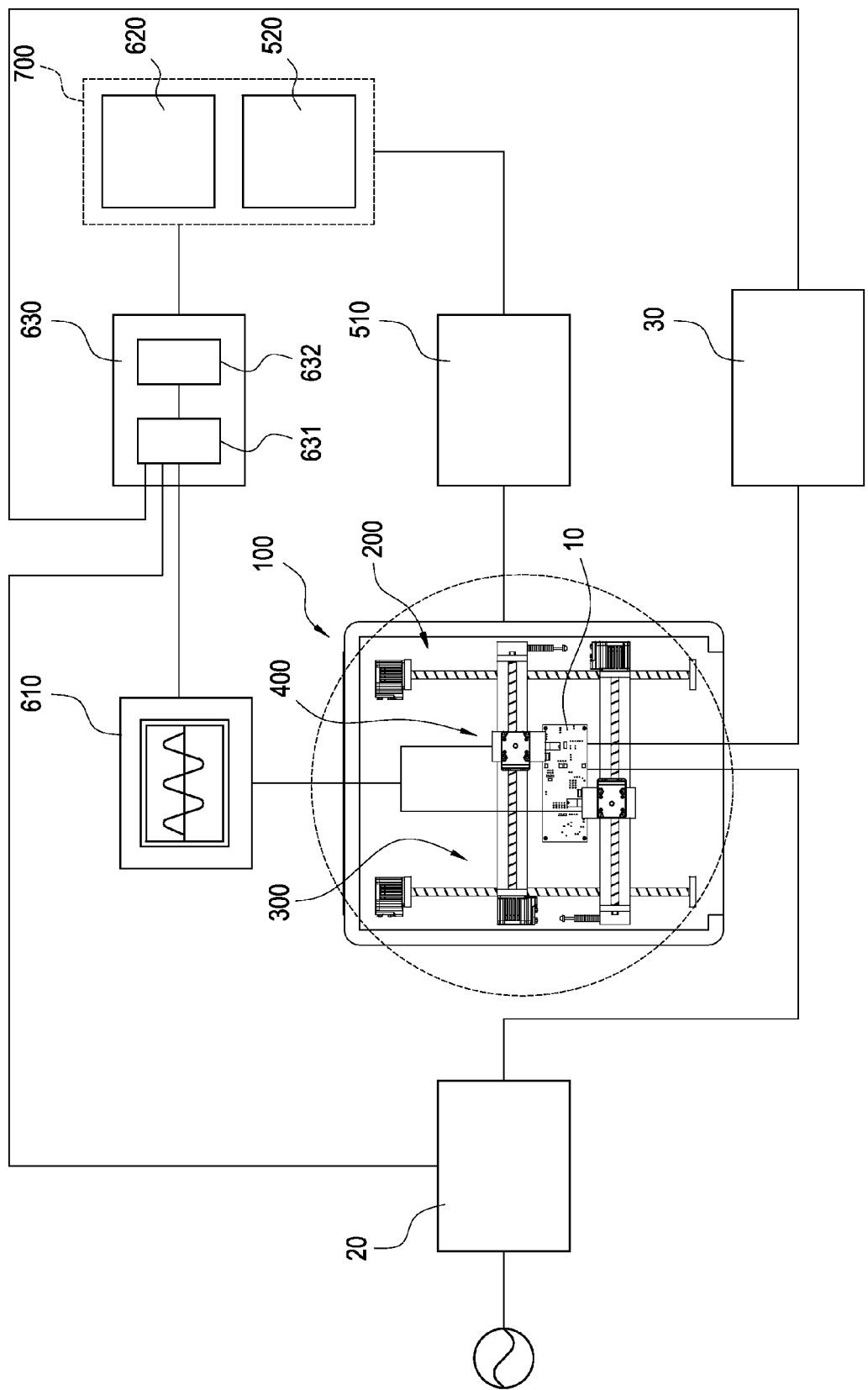
FIG. 7 is another schematic layout diagram of a block view of a power supply detection apparatus in accordance with the first preferred embodiment of the present invention.

In FIG. 7, the controlling device 520 and the recording device 620 are preferably integrated into a same computer 700, such that the computer 700 can control the movement of the probes 401 and capture the measured data. In addition, the AC power supply device 20 and the load simulator 30 may be connected to the computer 700 through an interface conversion device 630, such that the computer 700 can configure the AC power supply device 20 and the load simulator 30.

Figure 8:
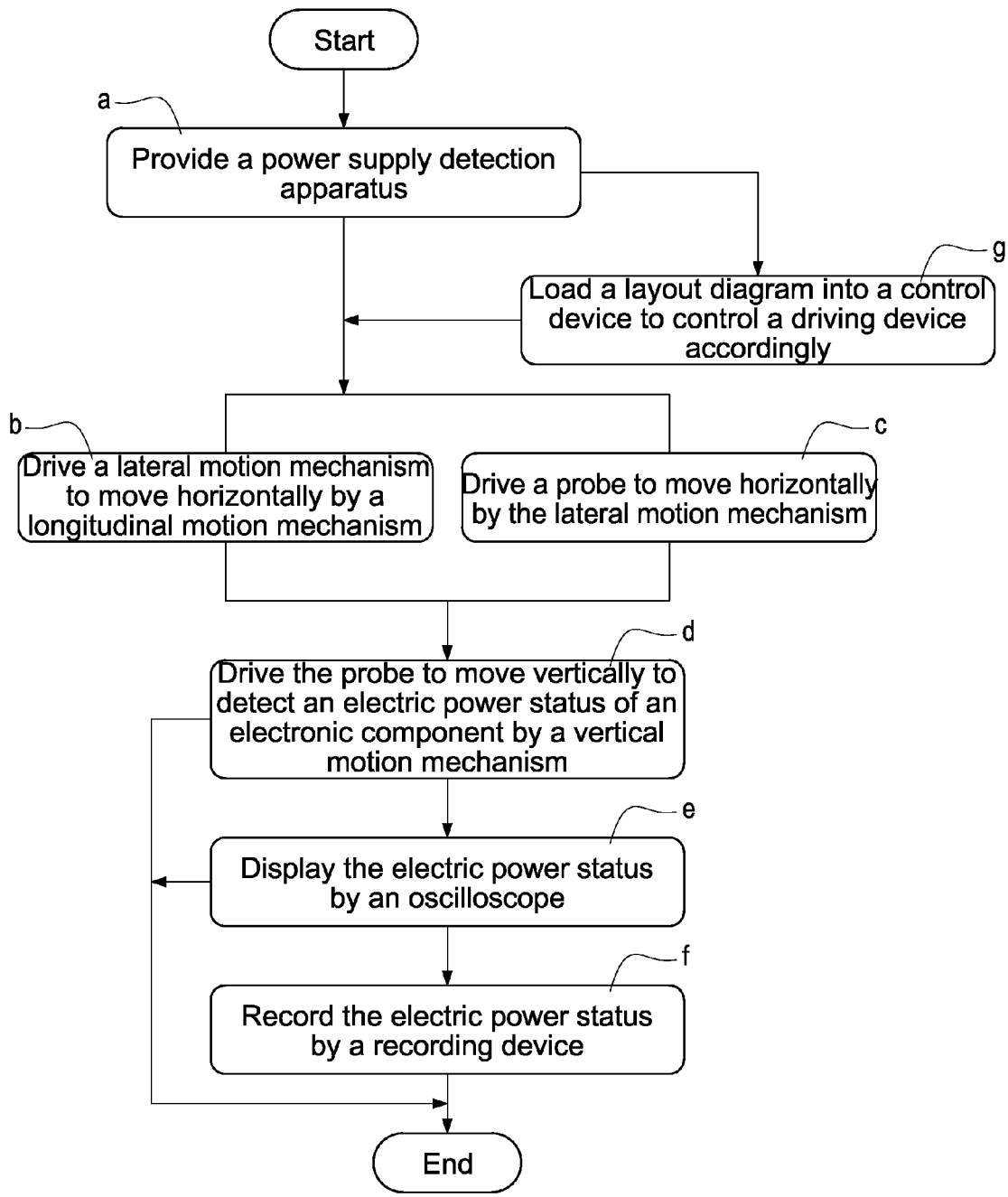
FIG. 8 is a flow chart of a power supply detection apparatus in accordance with a second preferred embodiment of the present invention.

With reference to FIG. 8 for a power supply detection method in accordance with the second preferred embodiment of the present invention, the method is provided for detecting the electric power status of an electronic component installed on a circuit board 10 (similar to the first preferred embodiment), the power supply detection method comprises the following steps (including Step (a) to Step (d)):

Step (a): Provide a power supply detection apparatus (same as the apparatus of the first preferred embodiment), wherein the power supply detection apparatus comprises a couple of longitudinal motion mechanisms 200, a couple of lateral motion mechanisms 300, a couple of probes 401, a couple of vertical motion mechanisms 410, a driving unit 510, an oscilloscope 610 electrically coupled to each probe, a recording device 620 electrically coupled to the oscilloscope 610, and a controlling device 520 electrically coupled to the driving unit 510.

Step (b) and Step (c) take place after Step (a), wherein the order of the Steps (b) and (c) may be exchanged with each other.

Step (b): Drive each longitudinal motion mechanism 200 to move the respective lateral motion mechanism 300 horizontally, so that each lateral motion mechanism 300 is aligned precisely with each pin of the electronic component to be tested.

Step (c): Drive each lateral motion mechanism 300 to move the respective probe 401 horizontally, so that each probe 401 is aligned precisely with each pin of the electronic component to be tested, wherein the moving direction of the probe 401 is perpendicular to the moving direction of lateral motion mechanism 300.

After Step (b) and Step (c), the probes 401 are situated at the top of the pins respectively.

Step (d): Use each vertical motion mechanism 410 to drive the respective probe 401 to move vertically, such that each probe 401 touches each respective pin, and use the probe 401 to detect each pin to obtain an electric power status between two pins of the electronic component to be tested.

In the power supply detection method of the present invention, the following steps (including Step (e) to Step (h)) may be included.

Step (e): Use the oscilloscope 610 to display the electric power status of the electronic component detected by the probe 401.

Step (f): Use the recording device 620 to record the electric power status of the electronic component detected by the probe 401.

Step (g): Preload a layout diagram of the electronic component of the circuit board 10 into the controlling device 520, such that the controlling device 520 may execute the Steps (b) to (d) automatically by the preloaded software program, and the controlling device 520 controls the driving unit 510 to drive each longitudinal motion mechanism 200, each lateral motion mechanism 300 and each vertical motion mechanism 410 to move the probe 401 according to the layout diagram, such that each probe 401 touches each respective pin of the electronic component of the circuit board to be tested.

In the power supply detection method of the present invention, the probes 401 are moved automatically to continuously detect the voltage of the electronic components installed on the circuit board 10, and the recording device 620 is provided for capture the measured result.

While the invention has been described by means of specific embodiments, numerous modifications and variations could be made thereto by those skilled in the art without departing from the scope and spirit of the invention set forth in the claims.

What is claimed is:

1. A power supply detection apparatus, for detecting an electric power status of an electronic component installed on a circuit board of a power supply, comprising:
   a base,
   two longitudinal motion mechanisms, arranged on the base;
   two lateral motion mechanisms driven by the two longitudinal motion mechanisms to move horizontally in a first direction;
   two pin bases, installed to the two lateral motion mechanisms respectively, and two probes being movably erected from the two pin bases, and each pin base being driven by the corresponding lateral motion mechanism to move horizontally in a second direction, and the first direction is perpendicular to the second direction; and
   two vertical motion mechanisms arranged onto the two pin base respectively, and coupled to the two probes respectively, and driving the two probes to move vertically, wherein a rubber crawler belt is coupled to each of the two probes for providing buffering function,
   wherein each of the two longitudinal motion mechanisms comprises a longitudinal screw and a longitudinal driving motor, and the two longitudinal screws are arranged parallelly with an interval apart from each other,
   wherein each of the two lateral motion mechanisms comprises a lateral screw and a lateral driving motor, and the two lateral screws are arranged parallelly with an interval apart from each other,
   wherein each of the two lateral motion mechanisms engages both of the two longitudinal motion mechanisms, and
   wherein a buffer rod is installed at one of the two lateral motion mechanisms towards the other one of the two lateral motion mechanisms.

2. The power supply detection apparatus of claim 1, wherein the longitudinal screw is installed horizontally onto the base, and the longitudinal driving motor is coupled to the longitudinal screw and provided for driving the longitudinal screw to rotate axially, and the two lateral motion mechanisms are engaged with the two longitudinal screws respectively.

3. The power supply detection apparatus of claim 2, wherein the lateral screw is installed horizontally, and arranged perpendicular to the longitudinal screw, and the lateral driving motor is coupled to the lateral screw and provided for driving the lateral screw to rotate axially, and the two pin bases are engaged with the two lateral screws respectively.

4. The power supply detection apparatus of claim 3, wherein each vertical motion mechanism comprises an elevation driving motor coupled to the probe and provided for driving the probe to move vertically in an axial direction.

5. The power supply detection apparatus of claim 4, further comprising a driving unit, electrically coupled to the longitudinal driving motor, the lateral driving motor and the elevation driving motor, and provided for driving the longitudinal driving motor, the lateral driving motor or the elevation driving motor to operate.

6. The power supply detection apparatus of claim 5, further comprising a controlling device electrically coupled to the driving unit for controlling the driving unit.

7. The power supply detection apparatus of claim 1, further comprising an oscilloscope electrically coupled to each probe.

8. The power supply detection apparatus of claim 7, further comprising a recording device electrically coupled to the oscilloscope.

9. The power supply detection apparatus of claim 8, further comprising an interface conversion device bridged between the oscilloscope and the recording device.

10. The power supply detection apparatus of claim 9, wherein the interface conversion device comprises a first connector and a second connector with different specification and electrically coupled to each other, and the oscilloscope is electrically coupled to the first connector, and the recording device is electrically coupled to the second connector.

11. The power supply detection apparatus of claim 10, wherein the first connector comes with a GPIB specification, and the second connector comes with a USB specification.

12. A power supply detection method, for detecting an electric power status of an electronic component installed on a circuit board of a power supply, and each electronic component including a couple of pins, and the power supply detection method comprising the steps of:
    providing a power supply detection apparatus according to claim 1;
    loading a layout diagram of the electronic component into the power supply detection apparatus;
    using the power supply detection apparatus to move each probe to touch each respective pin according to the layout diagram and detect the electric power status of the electronic component; and
    using the power supply detection apparatus to record the electric power status of the electronic.

* * * * *